(12) United States Patent
Park et al.

(10) Patent No.: US 6,828,630 B2
(45) Date of Patent: Dec. 7, 2004

(54) CMOS DEVICE ON ULTRATHIN SOI WITH A DEPOSITED RAISED SOURCE/DRAIN, AND A METHOD OF MANUFACTURE

(75) Inventors: Heemyong Park, La Grangeville, NY (US); Byoung H. Lee, Wappingers Falls, NY (US); Paul D. Agnello, Wappingers Falls, NY (US); Dominic J. Schepis, Wappingers Falls, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/338,103

(22) Filed: Jan. 7, 2003

(65) Prior Publication Data

US 2004/0129979 A1 Jul. 8, 2004

(51) Int. Cl.[7] .......................... H01L 29/76; H01L 29/94; H01L 31/062; H01L 31/113; H01L 31/119
(52) U.S. Cl. ....................... 257/339; 257/340; 257/347; 257/350
(58) Field of Search ................................ 257/339, 340, 257/347, 350, 49

(56) References Cited

U.S. PATENT DOCUMENTS

| | | | |
|---|---|---|---|
| 5,567,966 A | 10/1996 | Hwang | 257/347 |
| 5,814,553 A * | 9/1998 | Chuang et al. | 438/595 |
| 6,248,637 B1 | 6/2001 | Yu | 438/300 |
| 6,355,962 B1 | 3/2002 | Liang et al. | 257/369 |
| 6,372,589 B1 | 4/2002 | Yu | 438/304 |
| 6,403,433 B1 | 6/2002 | Yu et al. | 438/300 |
| 6,403,434 B1 | 6/2002 | Yu | 438/300 |
| 2002/0053711 A1 * | 5/2002 | Chau et al. | 257/412 |

* cited by examiner

*Primary Examiner*—William M. Brewster
(74) *Attorney, Agent, or Firm*—McGinn & Gibb, PLLC; Margaret A. Pepper, Esq.

(57) ABSTRACT

A method and structure for a CMOS device comprises depositing a silicon over insulator (SOI) wafer over a buried oxide (BOX) substrate, wherein the SOI wafer has a predetermined thickness; forming a gate dielectric over the SOI wafer; forming a shallow trench isolation (STI) region over the BOX substrate, wherein the STI region is configured to have a generally rounded corner; forming a gate structure over the gate dielectric; depositing an implant layer over the SOI wafer; performing one of N-type and P-type dopant implantations in the SOI wafer and the implant layer; and heating the device to form source and drain regions from the implant layer and the SOI wafer, wherein the source and drain regions have a thickness greater than the predetermined thickness of the SOI wafer, wherein the gate dielectric is positioned lower than the STI region.

19 Claims, 10 Drawing Sheets

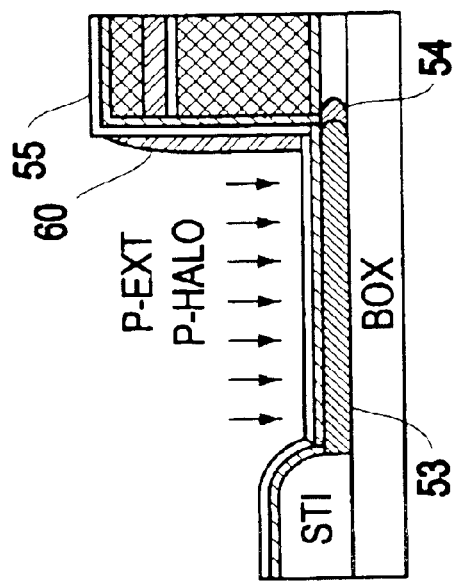
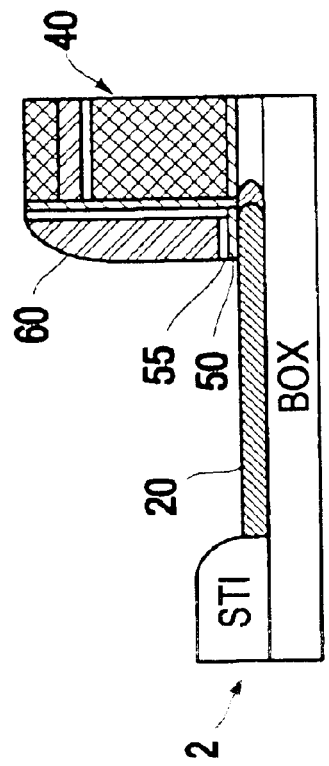
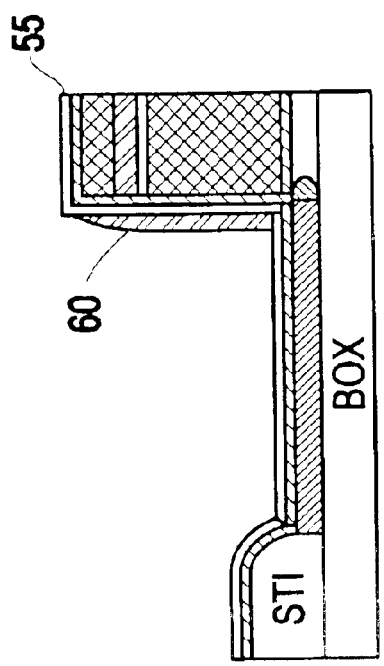
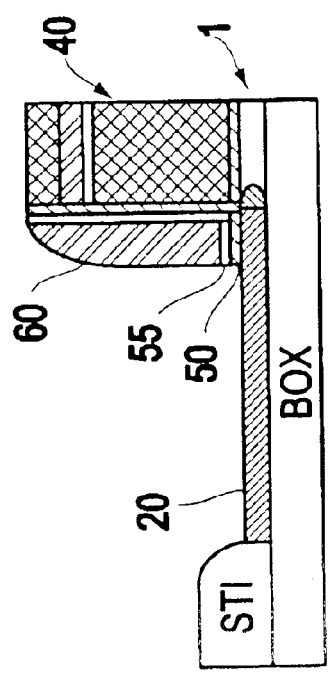

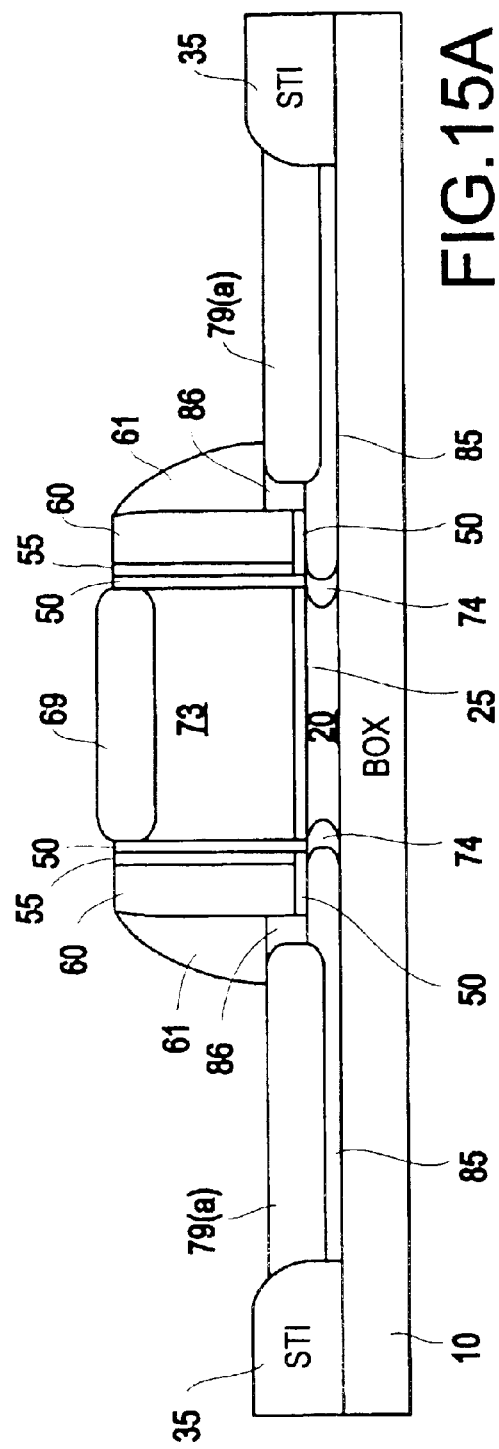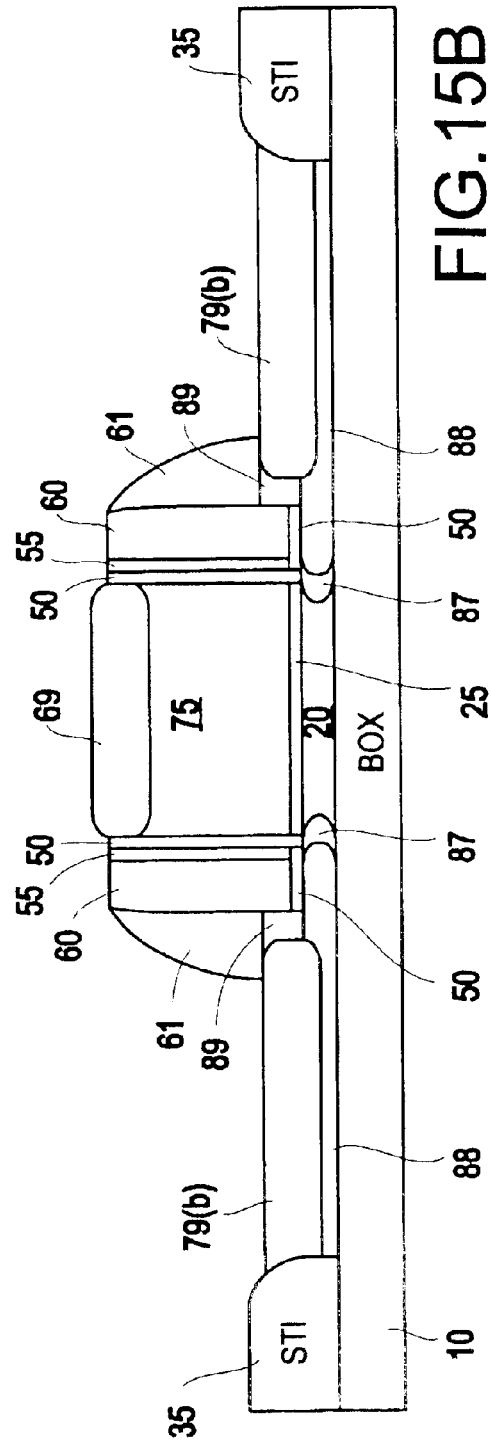

CMOS DEVICE ON ULTRATHIN SOI WITH A DEPOSITED RAISED SOURCE/DRAIN, AND A METHOD OF MANUFACTURE

BACKGROUND OF THE INVENTION

1. Field of the Invention

The present invention generally relates to CMOS devices, and more particularly to processing CMOS devices with raised source/drain layers on an ultrathin film SOI.

2. Description of the Related Art

The problems of conventional raised source/drain (RSD) layers with silicon selective epitaxy have been observed during CMOS development. Some solutions such as NiSi formation, which consumes less amounts of silicon, are being developed but have several limitations such as poor thermal stability. Moreover, conventional processing of high-performance CMOS devices with RSD layers on a thin film silicon over insulator (SOI) substrate are subject to the following problems. First, there are challenges of forming an RSD device with silicon selective epitaxy. Conventional processes of RSD involve selective epitaxial growth at high temperatures (typically>825° C.) and chemical etch/clean processing during a pre-cleaning process of the doped source/drain (S/D) surfaces. This epitaxial (epi) process is known to be the cause of several technological challenges which hinders the manufacturing of a CMOS device with RSD on an ultrathin SOI. First, the high temperature cycle causes transient enhanced diffusion (TED) of dopants (source/drain extension and halo) that are already introduced in the channel region before the epitaxial step. This is known to induce significant short channel effects such as threshold voltage ($V_{th}$) rolloff.

Second, the interface between the epitaxial layer and the existing source/drain regions on the substrate may cause sizable amounts of variability and lack of uniformity of the silicide layer which is formed after the epitaxial process, as well as an increase in S/D resistance. Third, this pre-cleaning process can damage the thin shallow trench isolation (STI) region that is also made of oxide. Fourth, remnants of the epitaxial layer (facets) are formed at the sidewall spacer during the epitaxial process which may contribute to a varying distribution of source/drain dopants that may be implanted after the epitaxial process, thereby negatively impacting device performance. Overall, the conventional epitaxial process involves a complicated surface chemistry in the processing of a CMOS device. Moreover, it has been very difficult to make it viable for CMOS production in the industry.

Therefore, there is a need for a novel CMOS device with raised source/drain layers on an ultrathin film SOI and a method of manufacturing the same, which overcomes the limitations of the conventional processes and structures.

SUMMARY OF THE INVENTION

In view of the foregoing, the present invention provides a raised source/drain silicon over insulator transistor device comprising a buried oxide (BOX) layer; a SOI wafer over the BOX layer; a gate dielectric over the SOI wafer; a gate region over the gate dielectric; an implant layer adjacent the SOI wafer, the implant layer comprising a deposited material; source and drain regions above the implant layer and the SOI wafer; and a shallow trench isolation (STI) region adjacent the source/drain region, wherein the STI region has an upper surface that is higher than an upper surface of the gate dielectric. The device further comprises at least one insulating spacer surrounding the gate region. The SOI wafer has a predetermined thickness, and the source/drain region has a thickness greater than the predetermined thickness of the SOI wafer. Moreover, the STI region has a generally rounded corner, wherein the STI region borders the source and drain regions. Furthermore, the dopant layer comprises one of polysilicon and amorphous silicon. Additionally, the source and drain regions are free of epitaxially related defects. In other words, the source and drain regions comprise a non-epitaxial material. Alternatively, an embodiment of the invention provides a CMOS device comprising a buried oxide (BOX) layer; a silicon over insulator (SOI) wafer over the BOX layer, the SOI wafer having a predetermined thickness; a gate structure over the SOI wafer; a gate dielectric between the gate structure and the SOI wafer, the gate dielectric positioned at a first height above the BOX layer; an implant layer adjacent the SOI wafer, the implant layer comprising a deposited material; source and drain regions in the implant layer and the SOI wafer, wherein the source/drain region has a thickness greater than the predetermined thickness of the SOI wafer; and a shallow trench isolation (STI) region having a generally rounded corner and positioned above the BOX layer, wherein an upper surface of the STI region is higher above the BOX layer than the first height. The CMOS device further comprises at least one insulating spacer surrounding the gate structure. The predetermined thickness of the SOI wafer is less than 55 nanometers, and the thickness of the source/drain region is in the range of 200–300 angstroms. Also, the dopant layer comprises one of polysilicon and amorphous silicon.

A method of fabricating a CMOS device comprises depositing a silicon over insulator (SOI) wafer over a buried oxide (BOX) substrate, wherein the SOI wafer has a predetermined thickness; forming a gate dielectric over the SOI wafer; forming a shallow trench isolation (STI) region over the BOX substrate, wherein the STI region is configured to have a generally rounded corner; forming a gate structure over the gate dielectric; depositing an implant layer over the SOI wafer; performing one of N-type and P-type dopant implantations in the SOI wafer and the implant layer; and heating the device to form source and drain regions from the implant layer and the SOI wafer, wherein the source and drain regions have a thickness greater than the predetermined thickness of the SOI wafer, wherein the gate dielectric is positioned lower than the STI region.

The method further comprises forming at least one insulating spacer surrounding the gate structure. Moreover, the implant layer comprises one of polysilicon and amorphous silicon. Additionally, the gate structure is formed by depositing a first gate polysilicon layer over the SOI wafer; depositing an oxide pad over the first gate polysilicon layer; depositing a sacrificial nitride layer over the oxide pad; and depositing a sacrificial second gate polysilicon layer over the sacrificial nitride layer. The predetermined thickness of the SOI wafer is less than 55 nanometers and the thickness of the source/drain region is in the range of 200–300 angstroms.

The present invention provides a unique solution for a low temperature RSD formation on an ultrathin SOI, gate postdoping, decoupling S/D and polysilicon doping, and gate stack height reduction, all together with high usability and manufacturability. There are several distinguishing features of the present invention over conventional devices and processes. First, the present invention provides a height difference (step) between the STI surface and the gate dielectric interface. Also, according to the present invention, there is the non-existence of several epitaxial-based RSD characteristics, which are inherent in conventional devices, such as facets, polysilicon grains, an interfacial concentration of oxygen, and the lateral overgrowth of selective epitaxy on the polysilicon gate. Moreover, according to the present invention, a non-epitaxial RSD polysilicon layer is globally formed over the STI region and the active areas.

The present invention achieves the following advantages. The present invention resolves all of the basic problems of selective epi-based RSD devices for CMOS on ultrathin SOI by forming RSD without relying on the epi. At the same time the present invention postdopes the polysilicon gate using the polysilicon on the source/drain as a buffer layer. Also, the present invention leads to the reduction of the polysilicon gate height using the same chemical mechanical polish (CMP) for the RSD polysilicon planarization. Furthermore, the present invention achieves RSD on ultrathin SOI with an aggressively scaled conventional gate structure for high performance logic CMOS device fabrication. Moreover, the present invention provides a method of isolating the source/drain electrodes formed by stepped STI and polysilicon etchback using the STI surface as a marker. Additionally, the present invention provides a method to solve problems associated with the polysilicon rail around the step-like corner of STI edge by rounding the corner during pad oxide etching and liner oxidation.

BRIEF DESCRIPTION OF THE DRAWINGS

The invention will be better understood from the following detailed description of a preferred embodiment(s) of the invention with reference to the drawings, in which:

FIG. 7(a) is a schematic diagram of a partially completed NFET component of a CMOS device according to the present invention;

FIG. 7(b) is a schematic diagram of a partially completed PFET component of a CMOS device according to the present invention;

FIG. 8(a) is a schematic diagram of a partially completed NFET component of a CMOS device according to the present invention;

FIG. 8(b) is a schematic diagram of a partially completed PFET component of a CMOS device according to the present invention;

FIG. 15(a) is a schematic diagram of a NFET component of a CMOS device according to the present invention;

FIG. 15(b) is a schematic diagram of a PFET component of a CMOS device according to the present invention;

DETAILED DESCRIPTION OF PREFERRED EMBODIMENTS OF THE INVENTION

Figure 1A:
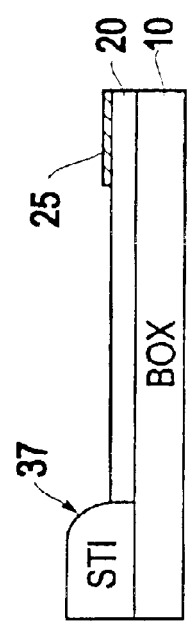
FIG. 1(a) is a schematic diagram of a partially completed NFET component of a CMOS device according to the present invention.

As previously mentioned, there is a need for a novel CMOS device with raised source/drain layers on an ultrathin film SOI and a method of manufacturing the same, which overcomes the limitations of the conventional processes and structures. The present invention provides a method of forming a scaled-down CMOS structure on a very thin SOI with a raised source/drain layer by polysilicon deposition and using a newly designed etchback process rather than silicon selective epitaxy used in conventional processes.

For ease of understanding, only one half of the CMOS devices 1, 2 are illustrated in the drawings (for example, only either the source or drain region is illustrated). FIGS. 15(a) and 15(b) show the full structure. Those skilled in the art would recognize that a mirror image of the structures exist for each of the devices 1, 2 in practice (for example, the corresponding drain or source region, respectively, exists on the other side of the gate structure 40). The present invention generally operates in the following manner. Taking the NFET device 1 shown in FIG. 15(a) as an example, an electrical signal enters at the source/drain region 79(a), 79(b) and passes through the channel region 20 to the complementary drain/source region 79(a), 79(b). As mentioned, only one half of the CMOS device 1, 2 is illustrated in the FIGS. 1(a) through 14(b). The CMOS device 1, 2 includes a STI region 35 having a generally rounded corner 37 formed above a buried oxide layer 10 and a gate dielectric 25, which serves as the conductive barrier between the gate 40 and the source/drain region 79(a), 79(b). A unique feature of the present invention is that the upper surface 36 of the STI region 35 is structurally higher than the gate dielectric interface 25. This is beneficial because, during processing, an elevated STI region 35 allows a portion of the implant layer 65 to remain even after a subsequent etchback process removes most of the implant layer 65. This essentially allows for a non-epitaxially-based process, which is beneficial as it eliminates TED effects on the dopants, and also reduces short channel effects such as threshold voltage ($V_{th}$) rolloff. Additionally, a generally curved STI corner 37 eliminates the amount of polysilicon remnants remaining on the STI after polysilicon deposition takes place, thereby improving device performance.

Referring now to the drawings, and more particular to FIGS. 1(a) through 18, there are shown preferred embodiments of the present invention. The progression of the processing steps for the NFET provided by the present invention are detailed in FIGS. 1(a) through 15(a), while the progression of the processing steps for the PFET provided by the present invention are detailed in FIGS. 1(b) through 15(b). Specifically, as shown in FIGS. 1(a) (NFET) and 1(b) (PFET), an ultrathin SOI wafer 20 (e.g. channel region), preferably less than 55 nm in thickness, is positioned above a buried oxide region 10. Thereafter, an oxide pad 25 and nitride layer 30 are sequentially deposited over the SOI wafer 20. The oxide pad 25 is a sacrificial layer used to protect a channel region 26 (shown in FIGS. 5(a) and 5(b)) and is also used to help form the rounded corner of the STI region 35 (shown in FIGS. 2(a) and 2(b)) during its wet etch removal. The thickness of the nitride layer 30, which will be subsequently removed during an etching process, is preferably dimensioned and configured to be approximately equal to the target thickness of the subsequent RSD layer, which is preferably approximately 200–300 angstroms.

Figure 2A:
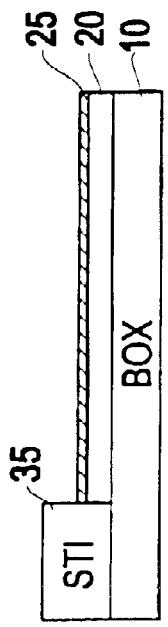
FIG. 2(a) is a schematic diagram of a partially completed NFET component of a CMOS device according to the present invention.

In the next step of the process, shown in FIGS. 2(a) (NFET) and 2(b) (PFET), an STI region 35 is formed after the nitride/oxide/SOI stack 15 is masked etched. This process includes the STI liner oxidation which aids in forming a rounded corner 37 of the STI, shown subsequently in FIGS. 4(a) and 4(b).

Figure 3A:
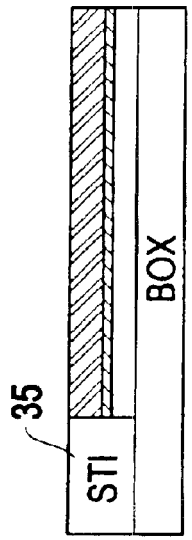
FIG. 3(a) is a schematic diagram of a partially completed NFET component of a CMOS device according to the present invention.
Figure 4A:
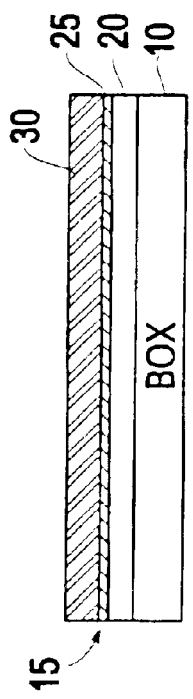
FIG. 4(a) is a schematic diagram of a partially completed NFET component of a CMOS device according to the present invention.
Figure 1B:
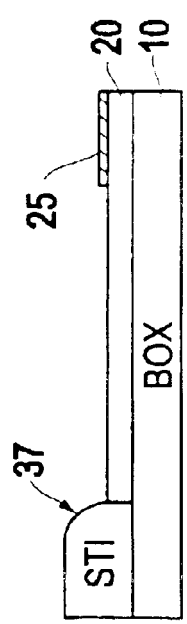
FIG. 1(b) is a schematic diagram of a partially completed PFET component of a CMOS device according to the present invention.
Figure 2B:
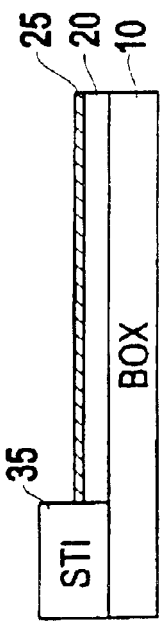
FIG. 2(b) is a schematic diagram of a partially completed PFET component of a CMOS device according to the present invention.
Figure 3B:
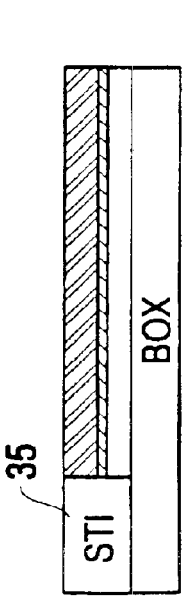
FIG. 3(b) is a schematic diagram of a partially completed PFET component of a CMOS device according to the present invention.
Figure 4B:
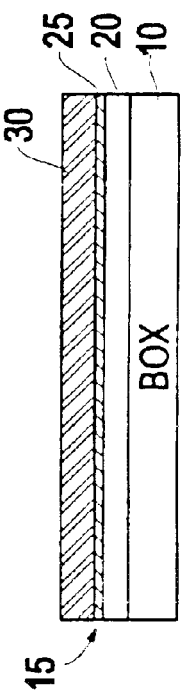
FIG. 4(b) is a schematic diagram of a partially completed PFET component of a CMOS device according to the present invention.

Next, as shown in FIGS. 3(a) (NFET) and 3(b) (PFET), the nitride layer 30 is removed using a wet etch process, thereby configuring a step with the STI region 35. As a result, the STI surface 35 is higher than the SOI surface 20. Thereafter, the pad oxide 25 is removed using a wet etch process, and simultaneously the corner 37 of STI 35 is rounded, as best illustrated in FIGS. 4(a) (NFET) and 4(b) (PFET). This process of rounding the corners 37 of the STI 35 prevents possible polysilicon rail problems from occurring in the next step of the process. The polysilicon rail problems involve leaving remnants of the gate polysilicon around the STI boundaries after polysilicon reactive ion etching (RIE), thereby negatively affecting device performance. Thus, by rounding the corners 37 of the STI 35, the present invention achieves better device performance than conventional devices, which do not have a rounded STI region. At this stage in the process, the step height of the STI region 35 above the SOI surface 20 is preferably approximately 300 angstroms.

Figure 5A:
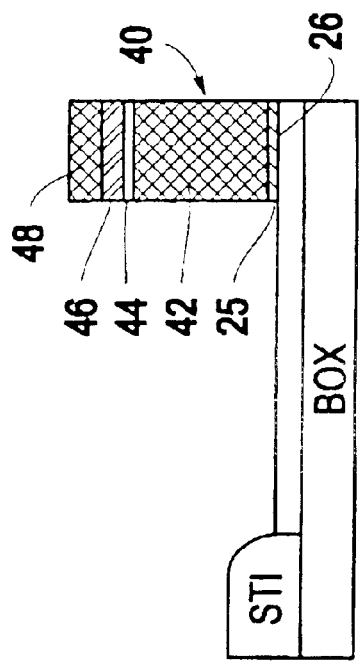
FIG. 5(a) is a schematic diagram of a partially completed NFET component of a CMOS device according to the present invention.

FIGS. 5(a) (NFET) and 5(b) (PFET) illustrate the next step of the invention, where a polysilicon gate stack 40 is patterned using a tetraethylorthosilicate (TEOS) hard mask (not shown). The polysilicon gate stack 40 is designed to be reduced in its height in later steps. The polysilicon gate stack 40 is formed by depositing a polysilicon layer 42, preferably having a target scaled-down height of approximately 100 nm. Then, a thin oxide layer 44, a nitride layer 46, and a buffer dummy polysilicon layer 48 are sequentially deposited. Next, a RIE process is performed, which forms the gate stack 40. If the STI 35, which is preferably approximately 300 angstroms, causes polysilicon thinning at the boundaries of the STI 35, the stack 40 may be optionally planarized using a CMP process after the polysilicon 42 deposition, then the thin oxide 44, nitride 46, and buffer dummy polysilicon 48 may be deposited, and then a RIE process may be performed to uniformly define the gate stack 40 over the boundaries of the STI 35.

Figure 6A:
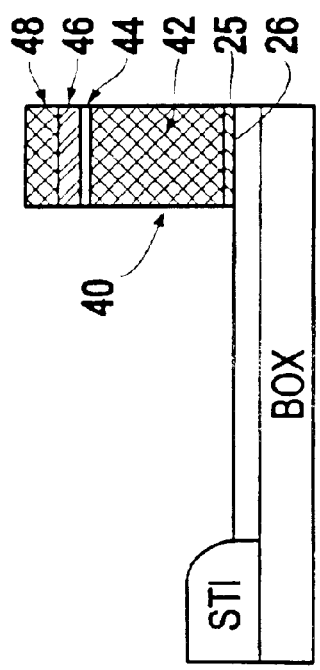
FIG. 6(a) is a schematic diagram of a partially completed NFET component of a CMOS device according to the present invention.
Figure 6B:
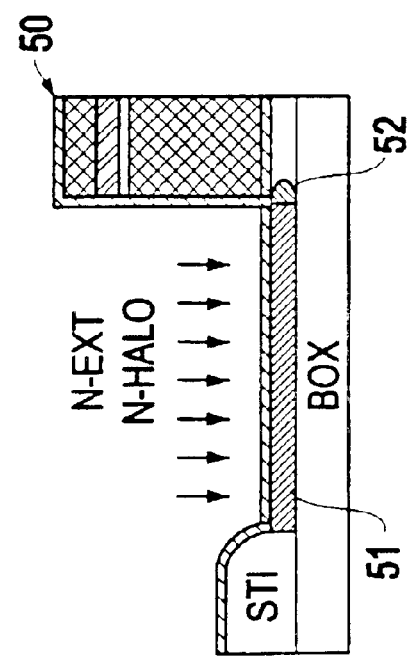
FIG. 6(b) is a schematic diagram of a partially completed PFET component of a CMOS device according to the present invention.

The next step of the process, as illustrated in FIGS. 6(a) (NFET) and 6(b) (PFET), is gate reoxidation, wherein an oxide or oxynitride insulator layer 50 is deposited over the SOI wafer 20, the STI region 35, and the polysilicon gate stack 40. Moreover, as shown in FIG. 6(a), an N-Extension/N-Halo implantation occurs in the SOI wafer 20. Region 51 represents the resulting N-type unannealed doping region, while region 52 represents the resulting P-type unannealed dopant region. Thereafter, a low temperature oxide (LTO) cap 55 is deposited over the oxide/oxynitride layer 50, which is best illustrated in FIGS. 7(a) (NFET) and 7(b) (PFET). Optionally a nitride spacer 60 may be formed along the side of the polysilicon gate 40. As seen, in FIG. 7(b), a P-Extension/Halo implantation occurs in the SOI wafer 20. Region 53 represents the resulting P-type unannealed doping region, while region 54 represents the resulting N-type unannealed dopant region.

Figure 9A:
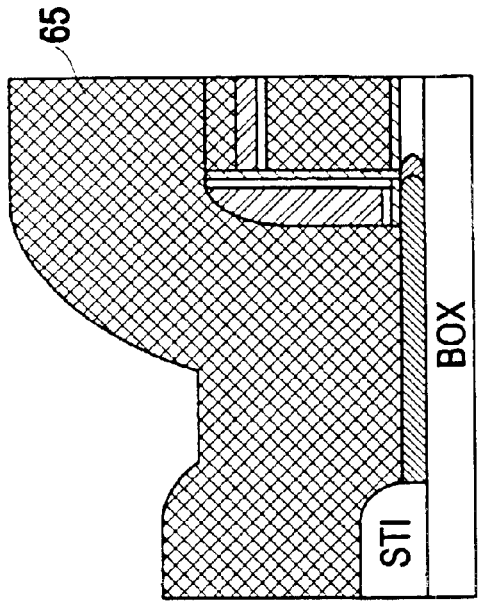
FIG. 9(a) is a schematic diagram of a partially completed NFET component of a CMOS device according to the present invention.
Figure 9B:
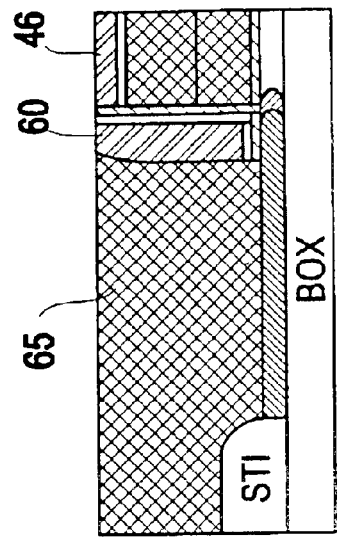
FIG. 9(b) is a schematic diagram of a partially completed PFET component of a CMOS device according to the present invention.

FIGS. 8(a) (NFET) and 8(b) (PFET) illustrate a further formation process of the nitride spacers 60 using rapid thermal chemical vapor deposition (RTCVD), wherein the spacers 60 are widened. Moreover, the LTO cap 55 and the insulator layer 50 are removed except for a portion configured between the spacers 60 and the SOI wafer 20 and a portion configured between the spacers 60 and the polysilicon gate stack 40. In the next step of the process as depicted in FIGS. 9(a) (NFET) and 9(b) (PFET), a layer 65 of polysilicon is deposited (e.g. non-epitaxially) over the NFET device 1 and PFET device 2, preferably at a low temperature of approximately 620° C. or below. The polysilicon layer 65, which prevents dopant migration into the channel 20, is deposited using low pressure chemical vapor deposition (LPCVD). Alternatively, an amorphous silicon layer (not shown) may be deposited over the devices 1, 2, preferably at a low temperature. Thus, the doped source/drain conductor 65 is formed using conformal deposition techniques as opposed to conventional epitaxial growth techniques used in conventional source/drain structures. This allows the conformally deposited layer 65 to be free of epitaxial defects.

Figure 5B:
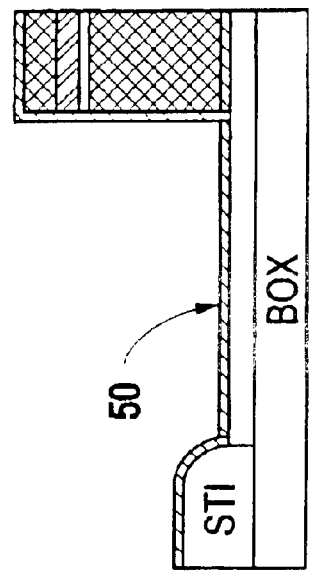
FIG. 5(b) is a schematic diagram of a partially completed PFET component of a CMOS device according to the present invention.
Figure 10A:
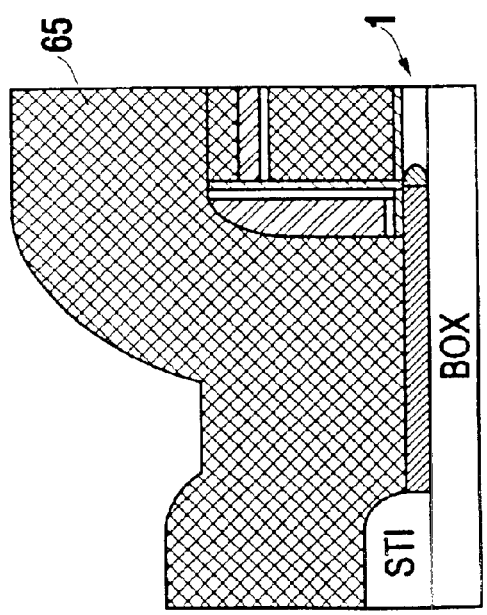
FIG. 10(a) is a schematic diagram of a partially completed NFET component of a CMOS device according to the present invention.
Figure 10B:
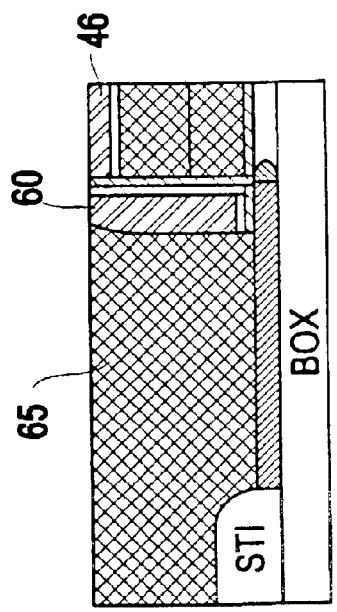
FIG. 10(b) is a schematic diagram of a partially completed PFET component of a CMOS device according to the present invention.

Next, in FIGS. 10(a) (NFET) and 10(b) (PFET), it is shown that the polysilicon layer 65 is planarized using an CMP process (for example, an Obsidian CMP process may be used as is known in the art), wherein the nitride layer 46 on top of polysilicon gate 40 is exposed. If the optional CMP process described during the process illustrated in FIGS. 5(a) and 5(b) is not used, the nitride surface 46 may not be exposed uniformly everywhere by the current Obsidian CMP process due to the STI step 35 created in during the process illustrated in FIGS. 3(a) and 3(b). In this case, the Obsidian CMP process may be optionally terminated when the dummy polysilicon layer 48 on top of the nitride 46 is exposed and the planarization is achieved. Thereafter, a short etchback process of the polysilicon layer 48 is performed to expose the nitride surface 46. Again, this etchback process is not necessary if the optional CMP process described in the steps shown in FIGS. 5(a) and 5(b) is used. Regardless of which of the preferred and optional processes described above are used, the resulting structures are shown in FIGS. 10(a) (NFET) and 10(b) (PFET), where the dummy polysilicon layer 48 on top of the nitride layer 46 of the gate structure 40 is removed by the Obsidian CMP process, and as a result, the polysilicon gate 40 height has been reduced to the desired target height, simultaneously with the formation of the S/D-blocking polysilicon layer 65.

Figure 11A:
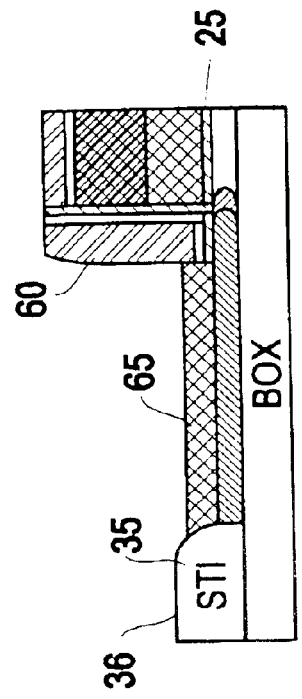
FIG. 11(a) is a schematic diagram of a partially completed NFET component of a CMOS device according to the present invention.
Figure 11B:
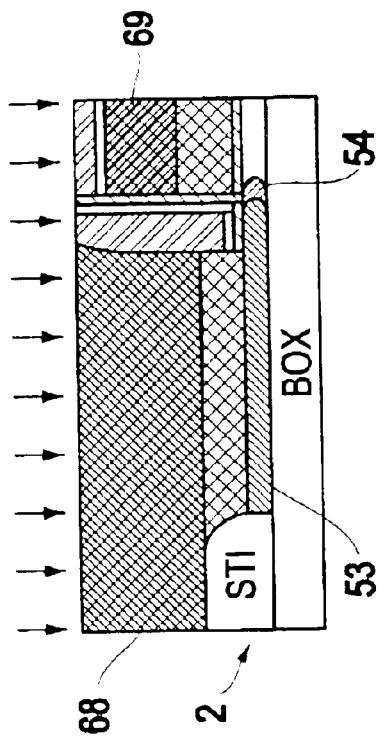
FIG. 11(b) is a schematic diagram of a partially completed PFET component of a CMOS device according to the present invention.
Figure 12A:
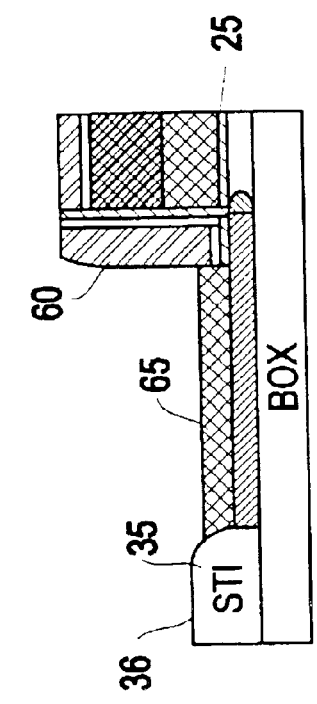
FIG. 12(a) is a schematic diagram of a partially completed NFET component of a CMOS device according to the present invention.
Figure 12B:
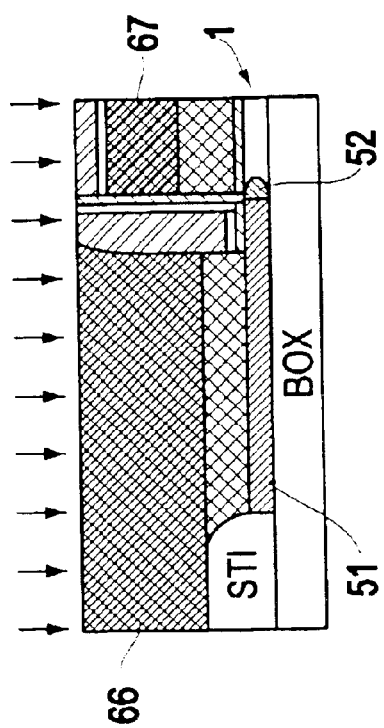
FIG. 12(b) is a schematic diagram of a partially completed PFET component of a CMOS device according to the present invention.

In the next step of the process, according to the present invention, the devices 1, 2 are subjected to gate postdoping implants. Specifically, as illustrated in FIGS. 11(a) (NFET) and 11(b) (PFET), the devices 1, 2 undergo a preamorphization process with neutral species followed by N-type and P-type dopants for N-Gate and P-Gate doping, respectively. Thus, the planarized polysilicon 65 on the S/D regions works as a buffer to decouple the gate doping from source/drain doping. Regions 66, 67 (along with regions 51, 54) represent the N-type unannealed doping region, while regions 68, 69 (along with regions 52, 53) represent the P-type unannealed doping region. Thereafter, as seen in FIGS. 12(a) (NFET) and 12(b) (PFET), the polysilicon layer 65 undergoes an etchback (dry etch or alternatively timed wet etch) process, stopping on the STI oxide surface 35. The remaining polysilicon 65 comprises the raised source/drain region. Moreover, because the polysilicon RSD 65 was deposited at a low temperature, the implanted extension and halo dopants do not receive any significant thermal cycles. Therefore, the problem of TED due to epitaxial-based RSD, as previously explained, is avoided. Furthermore, the present invention provides a height difference (step) between the STI region 35 and the gate dielectric 25 interface. That is, the upper surface 36 of the STI region 35 is structurally higher than the gate dielectric interface 25. This is beneficial because an elevated STI region 35 allows a portion of the polysilicon layer 65 to remain even after the etchback process removes most of the polysilicon layer 65, thereby providing a non-epitaxial layer for dopant implantation.

Figure 13B:
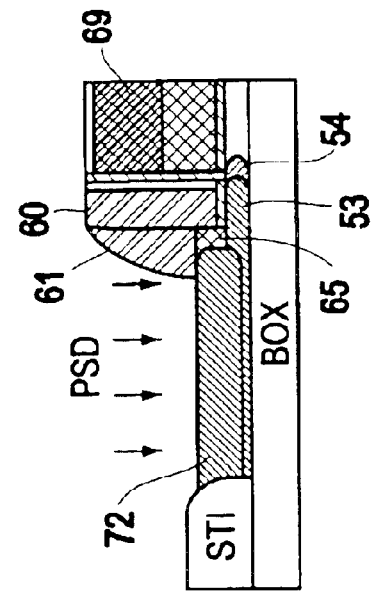
FIG. 13(b) is a schematic diagram of a partially completed PFET component of a CMOS device according to the present invention.
Figure 13A:
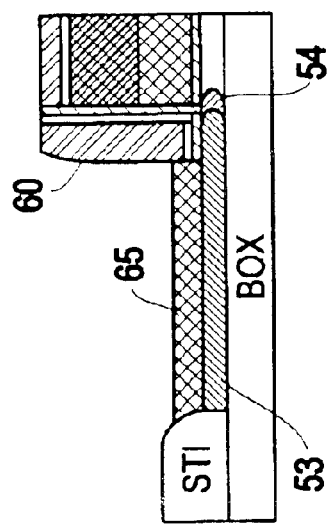
FIG. 13(a) is a schematic diagram of a partially completed NFET component of a CMOS device according to the present invention.

In FIG. 13(a) (NFET), the NFET 1 undergoes an NFET source/drain (NSD) arsenic implantation. By doing NSD arsenic implantation here using the existing thin nitride spacer 60, the N-extension/NSD doping is positioned as close to the gate channel 26 as possible, thereby maximizing the lateral doping level without hurting short channel characteristics, because arsenic is a slow diffuser compared to boron in a PFET. Thus, region 71, along with regions 51, 67, represent the resulting N-type unannealed doping region. The PFET illustrated in FIG. 13(b) remains unchanged from the previous step.

Figure 14B:
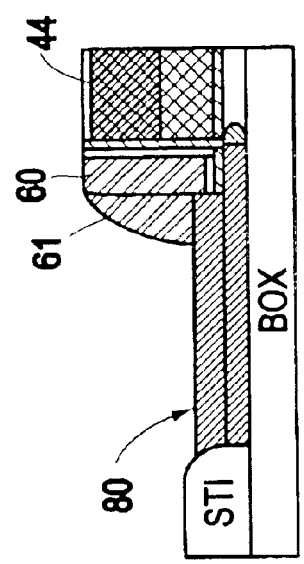
FIG. 14(b) is a schematic diagram of a partially completed PFET component of a CMOS device according to the present invention.
Figure 14A:
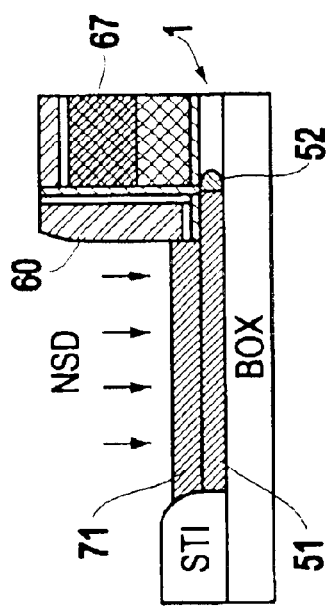
FIG. 14(a) is a schematic diagram of a partially completed NFET component of a CMOS device according to the present invention.

In FIGS. 14(a) (NFET) and 14(b) (PFET), a second nitride spacer 61 is deposited adjacent the first nitride spacer 60 using RTCVD. Thereafter, an RIE process removes the thin protective nitride layer 46 on top of polysilicon gate 40 during overetch. If the overetch affects the surface 80 of the RSD layer 71, 72, then optionally an LTO cap (not shown) may be deposited to protect the RSD layer 71, 72 before the final RTCVD nitride spacer deposition. FIG. 14(b) shows a PFET source/drain (PSD) boron/$BF_2$ implantation following the final nitride spacer 61 formation, which gives enough lateral spacing to minimize lateral encroachment of the boron in the PFET device 2 during the subsequent final thermal cycle. Region 72, along with regions 53, 69, represent the resulting the P-type unannealed doping region, while region 54 represents the resulting N-type unannealed doping region.

Thereafter, as illustrated in FIGS. 15(a) (NFET) and 15(b) (PFET), the devices 1, 2 undergo a final rapid thermal annealing (RTA) process to anneal all of the dopants, and preferably at a temperature of 950–1150° C. Because the non-epitaxial RSD 71, 72 is formed at very low temperatures and there are no other previous thermal cycles, the RTA process is the only annealing process which all of the dopants receive in the devices 1, 2. Therefore, the invention provides the absolute minimal redistribution of dopants for high performance deep sub 0.1 $\mu$m CMOS device fabrication. Regions 73, 85, 86 (shown in FIG. 15(a)) and region 87 (shown in FIG. 15(b)) represent the resulting N-type activated doping region, while region 74 (shown in FIG. 15(a)) and regions 75, 88, 89 (shown in FIG. 15(b)) represent the resulting P-type activated doping region. Region 70 represents the active region of the device 1, 2. The various regions of the device undergo various doping, implantation, and annealing processes, which result in new material properties and physical structures. For example, region 67 shown in FIG. 13(a) becomes region 73 shown in FIG. 15(a). Additionally, region 52 shown in FIG. 13(a) becomes region 74 shown in FIG. 15(a). Also, a portion of region 51 shown in FIG. 13(a) becomes region 85 shown in FIG. 15(a). Moreover, another portion of region 51 shown in FIG. 13(a) becomes region 86 shown in FIG. 15(a). Furthermore, region 69 shown in FIG. 14(b) becomes region 75 shown in FIG. 15(b). Likewise, region 54 shown in FIG. 14(b) becomes region 87 shown in FIG. 15(b). In addition, region 53 shown in FIG. 14(b) becomes region 88 shown in FIG. 15(b). Also, region 65 shown in FIG. 14(b) becomes region 89 shown in FIG. 15(b). Finally, regions 71, 72, shown in FIGS. 13(a) and 14(b), respectively, become regions 79(a), 79(b), shown in FIGS. 15(a) and 15(b), respectively. After this, silicidation and backend processing complete the process (not shown).

Figure 16:
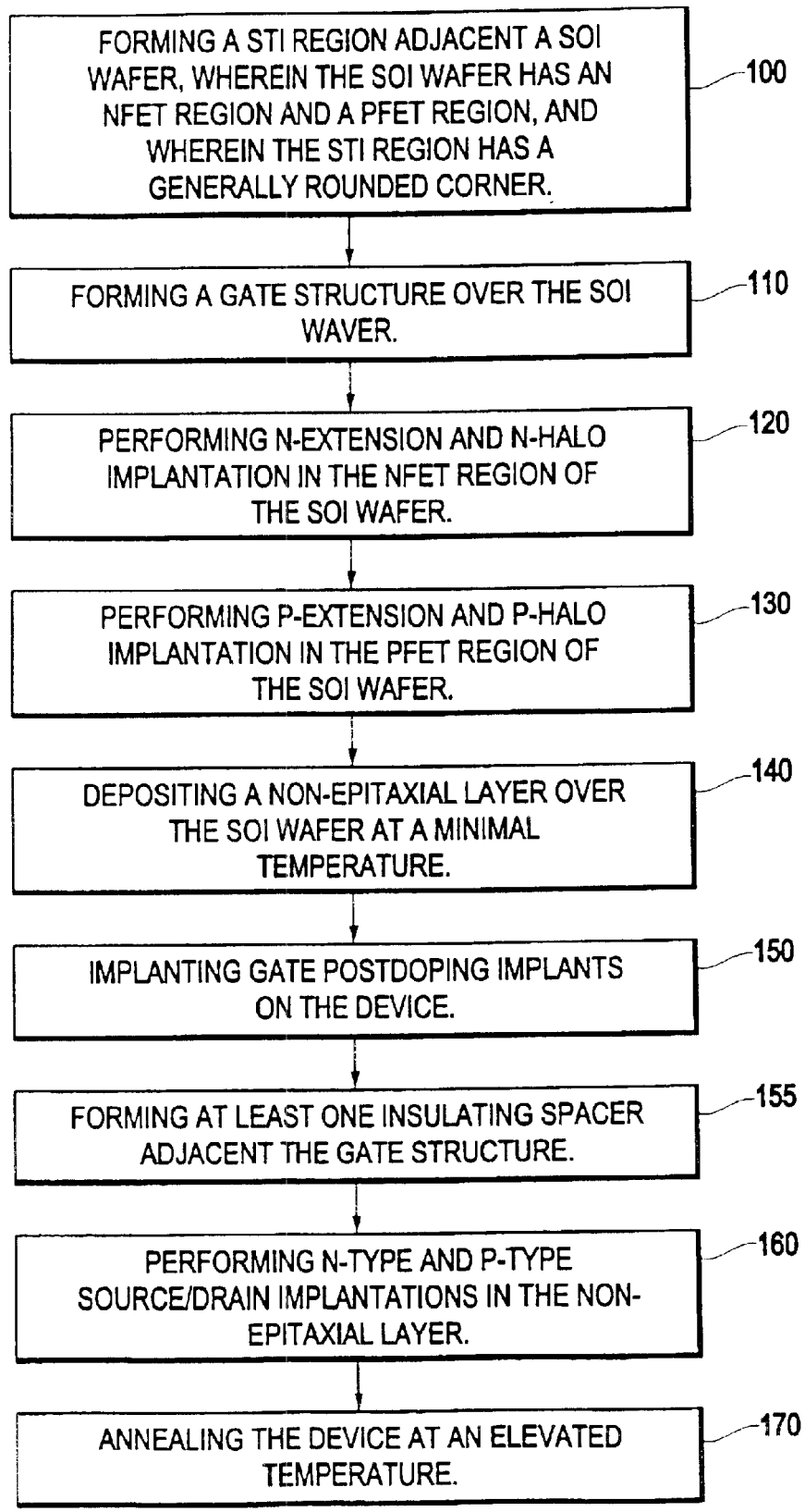
FIG. 16 is a flow diagram illustrating a preferred method of the invention.

A method of manufacturing a CMOS device 1, 2 is illustrated in the flow diagram of FIG. 16, wherein the method comprises forming 100 a STI region 35 adjacent a SOI wafer 20, wherein the SOI wafer 20 has an NFET region 51 and a PFET region 53, and wherein the STI region 35 has a generally rounded corner 37. The next steps involve forming 110 a gate structure 40 over the SOI wafer 20, performing 120 N-extension and N-halo implantation in the NFET region 51 of the SOI wafer 20, and performing 130 P-extension and P-halo implantation in the PFET region 53 of the SOI wafer 20. Thereafter, a non-epitaxial implant layer 65, preferably comprising one of polysilicon and amorphous silicon, is deposited 140 over the SOI wafer 20 at a minimal temperature of approximately 620° C. and less. The next step of the process involves implanting 150 gate postdoping implants on the device 1, 2. Optionally, the method comprises forming 155 at least one insulating spacer 60, 61 adjacent the gate structure 40. Then, N-type and P-type source/drain implantations are performed 160 in the implant layer 65. Finally, the device 1, 2 undergoes an annealing process 170 at an elevated temperature approximately in the range of 950–1150° C.

Figure 17:
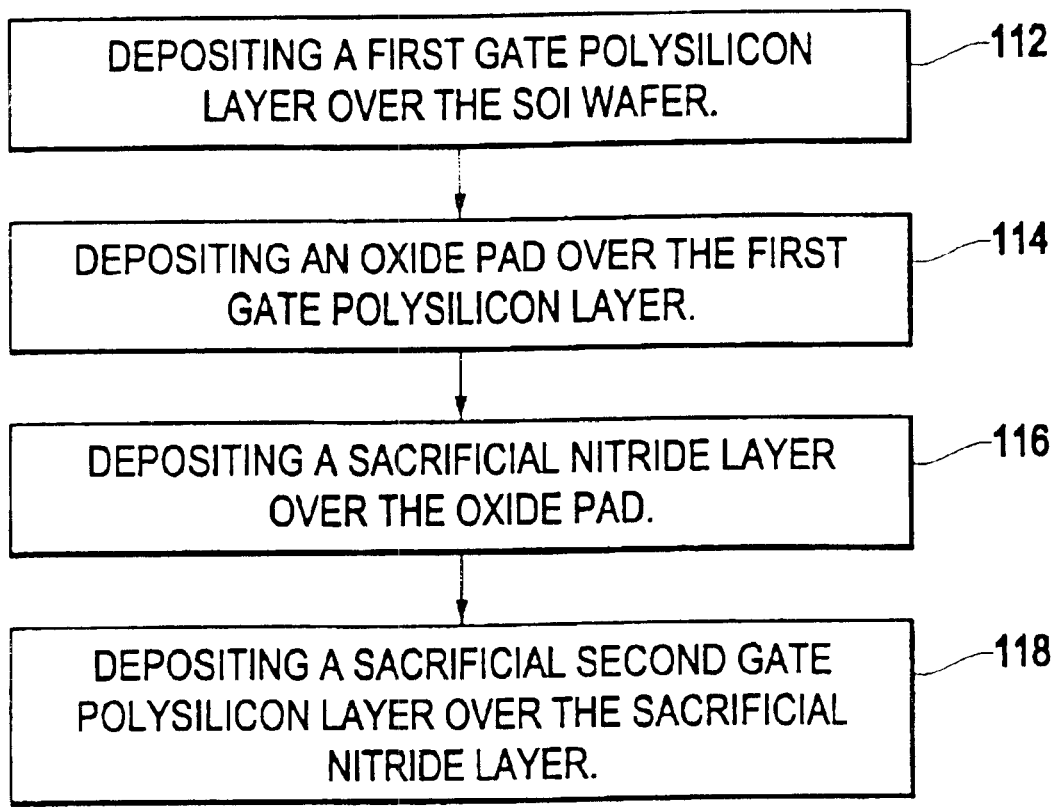
FIG. 17 is a flow diagram illustrating a preferred method of the invention.

As illustrated in the flow diagram of FIG. 17, the gate structure 40 is formed by depositing 112 a first gate polysilicon layer 42 over the SOI wafer 20, depositing 114 an oxide pad 44 over the first gate polysilicon layer 42, depositing 116 a sacrificial nitride layer 46 over the oxide pad 44, and depositing 118 a sacrificial second gate polysilicon layer 48 over the sacrificial nitride layer 46.

Figure 18:
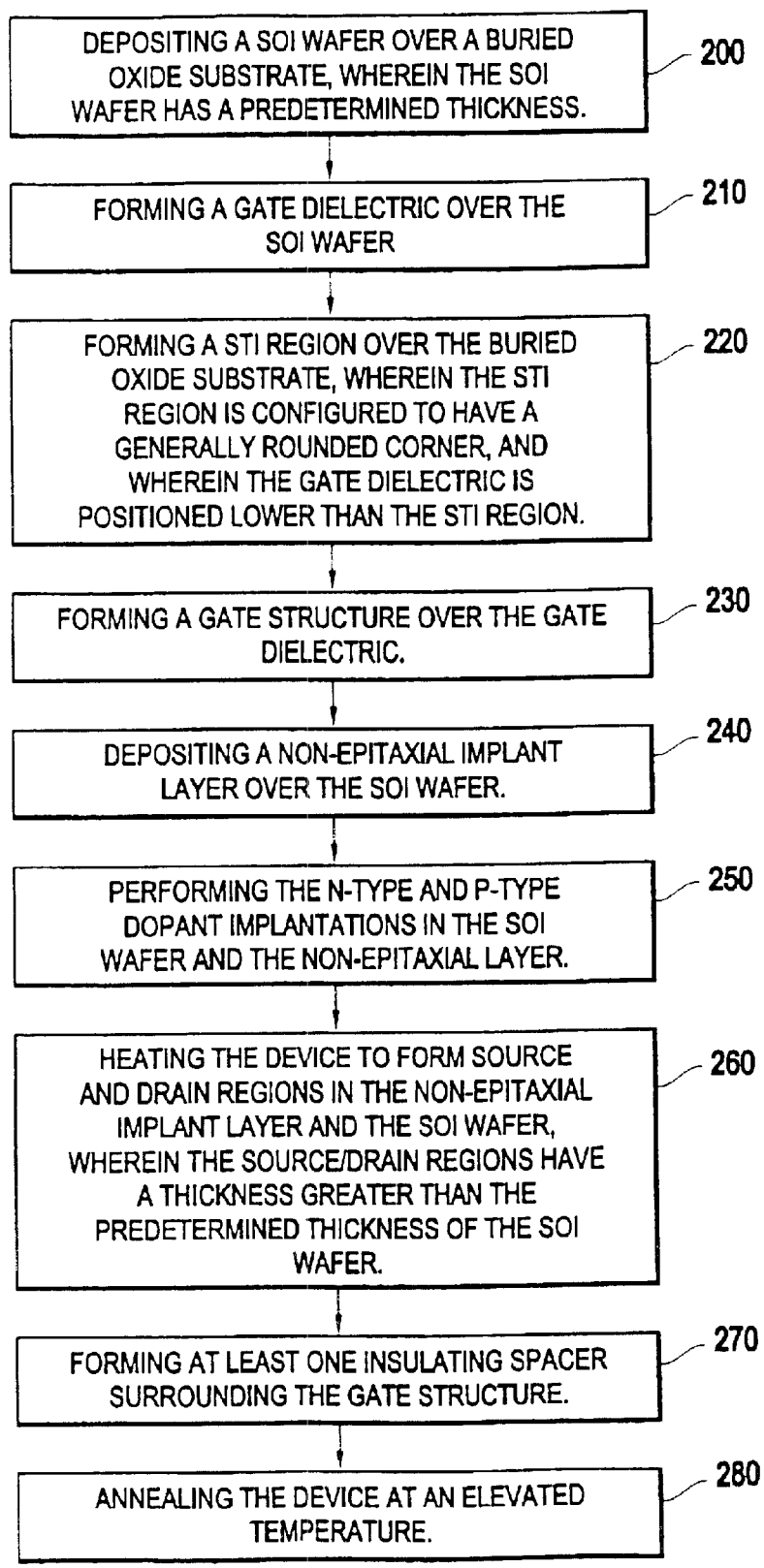
FIG. 18 is a flow diagram illustrating a preferred method of the invention.

Furthermore, the present invention provides a method of fabricating a CMOS device 1, 2 as illustrated in the flow diagram of FIG. 18, wherein the method comprises depositing 200 a SOI wafer 20 over a buried oxide substrate 10, wherein the SOI wafer 20 has a predetermined thickness. The next step involves forming 210 a gate dielectric 25 over the SOI wafer 20. Next, a STI region 35 is formed 220 over the buried oxide substrate 10, wherein the STI region 35 is configured to have a generally rounded corner 37, and wherein the gate dielectric 25 is positioned lower than the STI region 35. Then, a gate structure 40 is formed 230 over the gate dielectric 25 and a non-epitaxial implant layer 65 is deposited 240 over the SOI wafer 20. The next steps in the process involve performing 250 the N-type and P-type dopant implantations in the SOI wafer 20 and the implant layer 65, and heating 260 the device 1, 2 to form source and drain regions 85, 86, 88, 89 in the implant layer 65 and the SOI wafer 20, wherein the source/drain regions 85, 86, 88, 89 have a thickness greater than the predetermined thickness of the SOI wafer 20. The method further comprises forming 270 at least one insulating spacer 60, 61 surrounding the gate structure 40, and annealing 280 the CMOS device 1, 2 at an elevated temperature.

The present invention provides a unique solution for a low temperature RSD formation on an ultrathin SOI, gate postdoping, decoupling S/D and polysilicon doping, and gate stack height reduction, all together with high usability and manufacturability. There are several distinguishing features of the present invention over conventional devices and processes, some of which are described below. First, the present invention provides a height difference (step) between the STI surface 35 and the gate dielectric 25 interface. This is beneficial because an elevated STI allows a portion of the polysilicon layer 65 to remain even after the etchback process removes most of the polysilicon layer 65, thereby providing a non-epitaxial layer for dopant implantation. Also, according to the present invention, there is the non-existence of several epitaxial-based RSD characteristics, which are inherent in conventional devices, such as facets, polysilicon grains, an interfacial concentration of oxygen, and the lateral overgrowth of selective epitaxy on the polysilicon gate. Moreover, according to the present invention, a non-epitaxial RSD polysilicon layer 65 is globally formed over the STI region 35 and the active areas. Thus, after silicidation, the source/drain region (collectively 85, 86, 88, and 89) are shorted between the active region 79(a), 79(b).

The present invention generally operates in the following manner. Taking the NFET device 1 shown in FIG. 15(a) as an example, an electrical signal enters at the source/drain region 79(a), 79(b) and passes through the channel region 20 to the complementary drain/source region 79(a), 79(b). Thus, the invention works as a traditional transistor works. However, the CMOS device 1, 2 includes a STI region 35 having a generally rounded corner 37 formed above a buried oxide layer and a gate dielectric interface 25, which serves as the conductive barrier between the gate 40 and the source/drain region 74, 85, 86. A unique feature of the present invention is that the upper surface 36 of the STI region 35 is structurally higher than the gate dielectric interface 25. This is beneficial because, during processing, an elevated STI region 35 allows a portion of the implant layer 65 to remain even after a subsequent etchback process removes most of the implant layer 65. This essentially allows for a non-epitaxially-based process, which is beneficial as it eliminates TED effects on the dopants, and also reduces short channel effects such as threshold voltage ($V_{th}$) rolloff. Additionally, a generally curved STI corner 37 reduces the amount of polysilicon remnants remaining on the STI after polysilicon deposition takes place, thereby improving device performance.

The present invention achieves the following advantages. The present invention resolves all of the basic problems of selective epi-based RSD devices for CMOS on ultrathin SOI by forming RSD without relying on the epi. At the same time the present invention postdopes the polysilicon gate using the polysilicon on the S/D as a buffer layer. Also, the present invention leads to the reduction of the polysilicon gate height using the same chemical mechanical polish (CMP) for the RSD polysilicon planarization. Furthermore, the present invention achieves RSD on ultrathin SOI with an aggressively scaled conventional gate structure for high performance logic CMOS device fabrication. Moreover, the present invention provides a method of isolating the S/D electrodes formed by stepped STI and polysilicon etchback using the STI surface as a marker. Additionally, the present invention provides a method to solve problems associated with the polysilicon rail around the step-like corner of STI edge by rounding the corner during pad oxide etching and liner oxidation.

Combining the advantages described above, the invention enables the manufacturing of maximum-performance CMOS devices using ultrathin SOI substrates by building raised source/drain regions through deposition at a very low temperature, thereby completely avoiding problems such as silicide formation on thin SOI, short-channel degradation, and defects-associated problems at the epi-substrate interface caused by selective-epi-based raised source/drain process at high temperatures.

While the invention has been described in terms of preferred embodiments, those skilled in the art will recognize that the invention can be practiced with modification within the spirit and scope of the appended claims. Moreover, only one half of the CMOS devices 1, 2 are illustrated in the drawings for ease of understanding (for example, only either the source or drain region is illustrated). Those skilled in the art would recognize that a mirror image of the structures exist for each of the devices 1, 2 in practice (for example, the corresponding drain or source region, respectively, exists on the other side of the gate structure 40).

What is claimed is:

1. A raised source/drain (RSD) silicon over insulator (SOI) transistor device comprising:

a buried oxide (BOX) layer;

a SOI wafer over said BOX layer;

a gate dielectric over said SOI wafer, a gate region over said gate dielectric;

at least four insulating layers on opposite sides of said gate region, wherein said at least four insulating layers comprise co-planar upper surfaces; wherein a composition of the first insulating layer, a composition of the second insulating layer, and a composition including both the third and fourth insulating layers are materially different from each other;

an implant layer adjacent said SOI wafer, said implant layer comprising a deposited material;

source and drain regions above said implant layer and said SOI wafer; and a shallow trench isolation (STI) region adjacent said source/drain region, wherein said STI region has an upper surface that is higher than an upper surface of said gate dielectric.

2. The device of claim 1, wherein a first of said insulating layers is adjacent to said gate region and comprises any of an oxide and oxynitride, wherein a second of said insulating layers is adjacent to the first insulating layer and comprises a low temperature oxide (LTO), wherein a third of said insulating layers is adjacent to the first and second insulating layers and comprises nitride, and wherein a fourth of said insulating layers is adjacent to said third insulating layer and comprises nitride.

3. The device of claim 1, wherein said SOI wafer has a predetermined thickness, and wherein said source/drain region has a thickness greater than said predetermined thickness of said SOI wafer.

4. The device of claim 3, wherein said STI region has a generally rounded corner, wherein said STI region borders said source and drain regions.

5. The device of claim 1, wherein said implant layer comprises one of polysilicon and amorphous silicon.

6. The device of claim 1, wherein said source and drain regions are free of epitaxially related defects.

7. The device of claim 1, wherein said source and drain regions comprise a non-epitaxial material.

8. A CMOS device comprising:

a buried oxide (BOX) layer;

a silicon over insulator (SOI) wafer over said BOX layer, said SOI wafer having a predetermined thickness;

a gate structure over said SOI wafer;

at least four insulating layers on opposite sides of said gate structures, wherein said at least four insulating layers comprise co-planar upper surfaces; wherein a composition of the first insulating layer, a composition of the second insulating layer, and a composition including both the third and fourth insulating layers are materially different from each other;

a gate dielectric between said gate structure and said SOI wafer, said gate dielectric positioned at a first height above said BOX layer;

an implant layer adjacent said SOI wafer, said implant layer comprising a deposited material;

source and drain regions in said implant layer and said SOI wafer, wherein said source/drain region has a thickness greater than said predetermined thickness of said SOI wafer; and a shallow trench isolation (STI) region having a generally rounded corner and positioned above said BOX layer, wherein an upper surface of said STI region is higher above said BOX layer than said first height.

9. The CMOS device of claim 8, wherein a first of said insulating layers is adjacent to said gate structure and comprises any of an oxide and oxynitride, wherein a second of said insulating layers is adjacent to the first insulating layer and comprises a low temperature oxide (LTO), wherein a third of said insulating layers is adjacent to the first and second insulating layers and comprises nitride, and wherein a fourth of said insulating layers is adjacent to said third insulating layer and comprises nitride.

10. The CMOS device of claim 8, wherein said predetermined thickness of said SOI wafer is less than 55 nanometers.

11. The CMOS device of claim 8, wherein said thickness of said source/drain region is in the range of 200–300 angstroms.

12. The CMOS device of claim 8, wherein said implant layer comprises one of polysilicon and amorphous silicon.

13. A transistor device comprising:

a buried oxide (BOX) layer;

a silicon over insulator (SOI) wafer over said BOX layer, said SOI wafer having a predetermined thickness;

a gate structure over said SOI wafer;

at least two spacers on opposite sides of said gate structure;

at least two insulating layers disposed in between said spacers and said gate structure, wherein said at least two spacers and said at least two insulating layers comprise co-planar upper surfaces; wherein a composition of the first insulating layer, a composition of the second insulating layer, and a composition including both the first and second spacers are materially different from each other;

an implant layer adjacent said SOI wafer, said implant layer comprising a deposited material;

source and drain regions above said implant layer and said SOI wafer; and a shallow trench isolation (STI) region adjacent said source/drain region, wherein said STI region has an upper surface that is higher than an upper surface of said gate dielectric.

14. The device of claim 13, wherein a first of said insulating layers is adjacent to said gate structure and comprises any of an oxide and oxynitride, wherein a second of said insulating layers is adjacent to the first insulating layer and comprises a low temperature oxide (LTO), wherein a first of said spacers is adjacent to the first and second insulating layers and comprises nitride, and wherein a second of said spacers is adjacent to the first spacer and comprises nitride.

15. The device of claim 13, wherein said SOI wafer has a predetermined thickness, and wherein said source/drain region has a thickness greater than said predetermined thickness of said SOI wafer.

16. The device of claim 15, wherein said STI region has a generally rounded corner, wherein said STI region borders said source and drain regions.

17. The device of claim 13, wherein said implant layer comprises one of polysilicon and amorphous silicon.

18. The device of claim 13, wherein said source and drain regions are free of epitaxially related defects.

19. The device of claim 13, wherein said source and drain regions comprise a non-epitaxial material.

* * * * *